(12) United States Patent
Baumeister et al.

(10) Patent No.: US 10,151,458 B2
(45) Date of Patent: Dec. 11, 2018

(54) FASTENING ELEMENT

(71) Applicant: BJB GmbH & Co. KG, Arnsberg (DE)

(72) Inventors: Olaf Baumeister, Sundern (DE); Herbert Beleke, Arnsberg (DE); Karl-Wilhelm Vogt, Ense (DE); Detlef Scholz, Soest (DE)

(73) Assignee: BJB GmbH & Co. KG, Arnsberg (DE)

( * ) Notice: Subject to any disclaimer, the term of this patent is extended or adjusted under 35 U.S.C. 154(b) by 491 days.

(21) Appl. No.: 14/933,292

(22) Filed: Nov. 5, 2015

(65) Prior Publication Data

US 2016/0230967 A1    Aug. 11, 2016

Related U.S. Application Data

(63) Continuation of application No. PCT/DE2014/200230, filed on May 21, 2014.

(30) Foreign Application Priority Data

Jul. 15, 2013    (DE) .................. 20 2013 006 325 U
Jul. 15, 2013    (DE) .................. 20 2013 006 326 U (Continued)

(51) Int. Cl.
    *F16B 2/24*    (2006.01)
    *F21V 19/00*   (2006.01)
    (Continued)

(52) U.S. Cl.
    CPC .............. *F21V 19/004* (2013.01); *F16B 2/24* (2013.01); *F16B 2/241* (2013.01); *F16B 5/125* (2013.01);
    (Continued)

(58) Field of Classification Search
    CPC .. F16B 2/24; F16B 2/243; F21V 17/08; F21V 17/14; F21V 17/16; F21V 17/162;
    (Continued)

(56) References Cited

U.S. PATENT DOCUMENTS

| 2,238,238 A | 4/1941 | Westrope |
| 2,245,375 A | 6/1941 | Wiley |

(Continued)

FOREIGN PATENT DOCUMENTS

| DE | 102008005823 B4 | 8/2009 |
| DE | 102010008040    | 8/2011 |

(Continued)

*Primary Examiner* — Robert J May
*Assistant Examiner* — Leah S Macchiarolo
(74) *Attorney, Agent, or Firm* — Von Rohrscheidt Patents

(57) ABSTRACT

A fastening element including a shaft; a shaft head arranged at an end of the shaft, wherein the shaft head has a larger diameter than the shaft, wherein the fastening element is provided for arranging a first component and a second component at each other, wherein the first component is provided as a circuit board provided with a LED and the second component is provided as a heat dissipating lamp element, wherein the shaft is insertable through a pass through opening of the first component and the shaft head is configured at least for an indirect contact at the first component, wherein the shaft is arrangeable in a recess of the second component, wherein the shaft is fixable at least through friction locking in the recess of the second component.

9 Claims, 4 Drawing Sheets

(30) Foreign Application Priority Data

Aug. 24, 2013 (DE) .................... 20 2013 007 589 U
Feb. 17, 2014 (DE) .................... 20 2014 001 330 U

(51) Int. Cl.
| | |
|---|---|
| *F16B 5/12* | (2006.01) |
| *F16B 21/08* | (2006.01) |
| *F21V 29/70* | (2015.01) |
| *H05K 7/14* | (2006.01) |
| *F21Y 101/00* | (2016.01) |

(52) U.S. Cl.
CPC ............ *F16B 21/086* (2013.01); *F21V 29/70* (2015.01); *H05K 7/1417* (2013.01); *F21Y 2101/00* (2013.01)

(58) Field of Classification Search
CPC .... F21V 17/164; F21V 17/166; F21V 17/168; F21V 19/0015; F21V 19/003; F21V 19/004; F21V 29/70
See application file for complete search history.

(56) References Cited

U.S. PATENT DOCUMENTS

| | | | |
|---|---|---|---|
| 2,265,957 A | 12/1941 | Tinnerman | |
| 2,594,211 A | 4/1952 | Poupitch | |
| 3,276,309 A | 10/1966 | Engstrom | |
| 5,261,772 A * | 11/1993 | Henninger | B62D 27/06 411/15 |
| 5,846,040 A | 12/1998 | Ueno | |
| 7,607,875 B2 * | 10/2009 | Shinozaki | F16B 19/1081 411/21 |
| 2005/0220560 A1 | 10/2005 | Shinozaki et al. | |
| 2006/0061997 A1 * | 3/2006 | Lin | F21K 9/00 362/294 |
| 2011/0116890 A1 * | 5/2011 | Okada | F16B 5/0642 411/358 |
| 2015/0103515 A1 * | 4/2015 | Bosua | F21V 29/83 362/157 |
| 2016/0209023 A1 * | 7/2016 | Tseng | F21V 31/005 |

FOREIGN PATENT DOCUMENTS

| | | |
|---|---|---|
| DE | 202012002831 | 4/2012 |
| DE | 102012003520 B4 | 8/2013 |
| DE | 202013006326 U1 | 9/2013 |
| DE | 202014001330 U1 | 4/2014 |
| DE | 202013006325 U1 | 11/2014 |
| DE | 202013007589 U1 | 1/2015 |
| EP | 0348258 | 12/1989 |
| FR | 789664 | 11/1935 |
| FR | 1417603 | 11/1965 |
| FR | 2064487 | 7/1971 |
| FR | 2790046 | 8/2000 |
| FR | 2928428 | 9/2009 |
| WO | WO2005071273 A1 | 8/2005 |
| WO | WO2007104530 | 9/2007 |
| WO | WO2011103068 | 8/2011 |
| WO | WO2012166552 | 12/2012 |

* cited by examiner

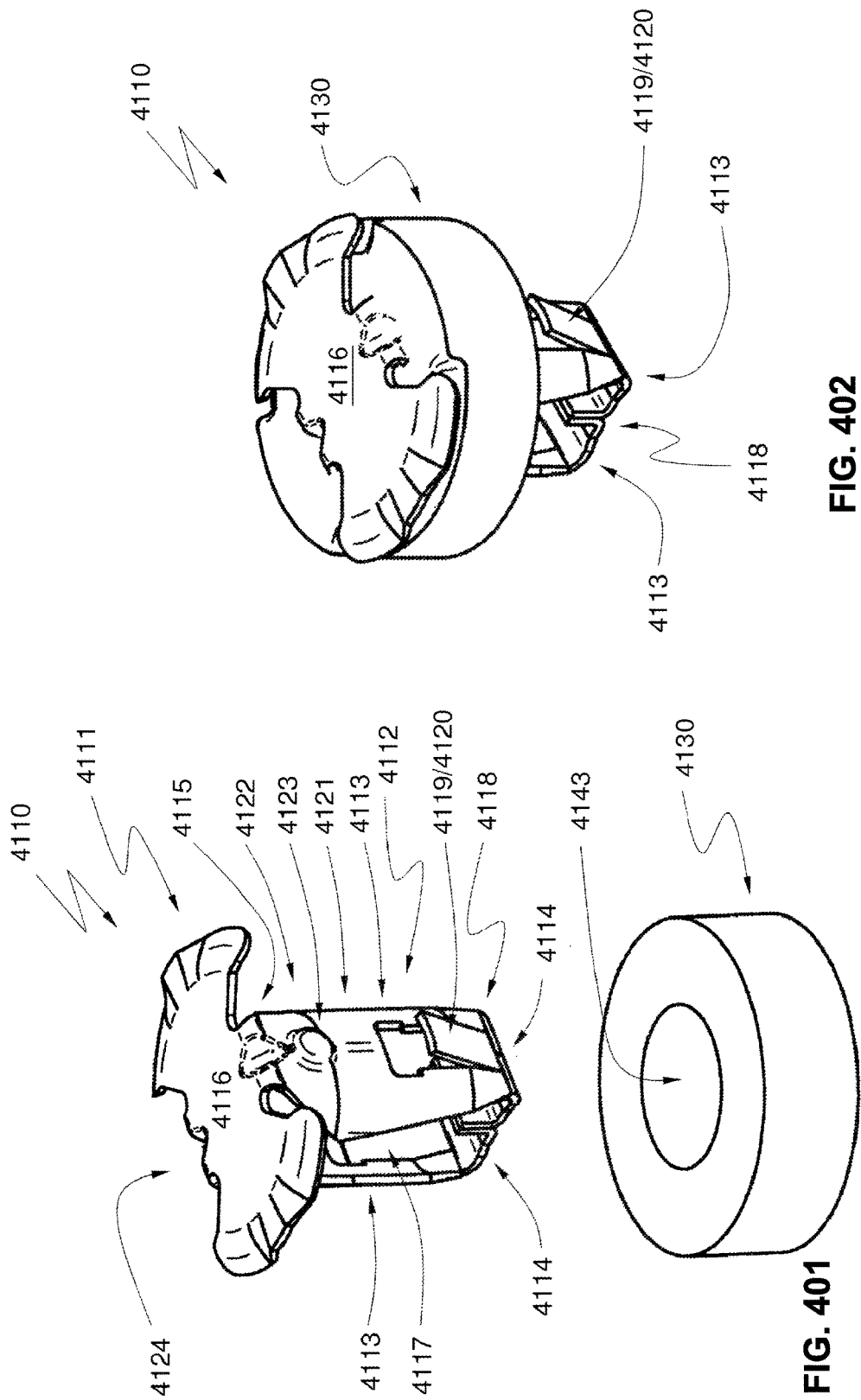

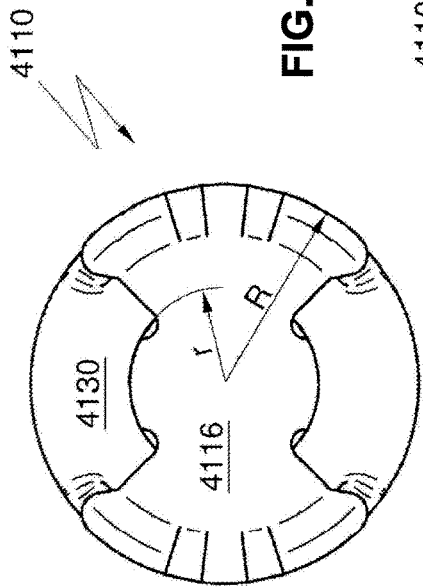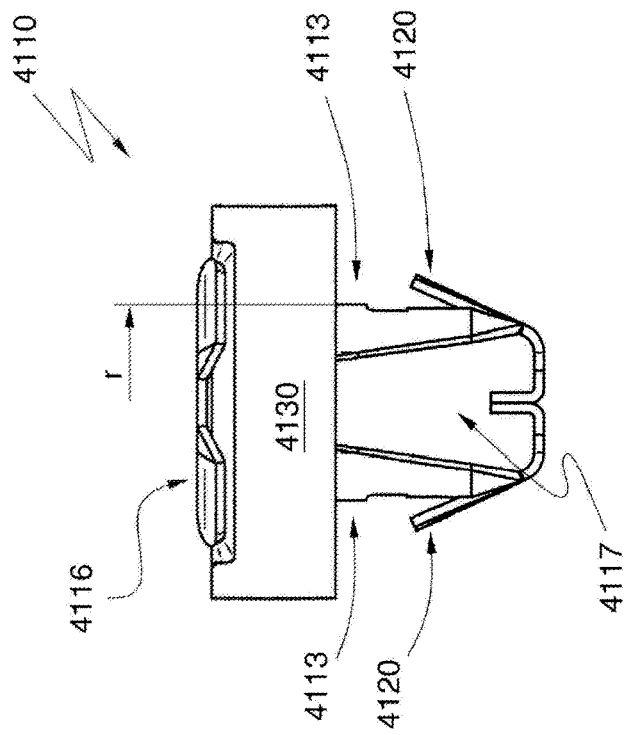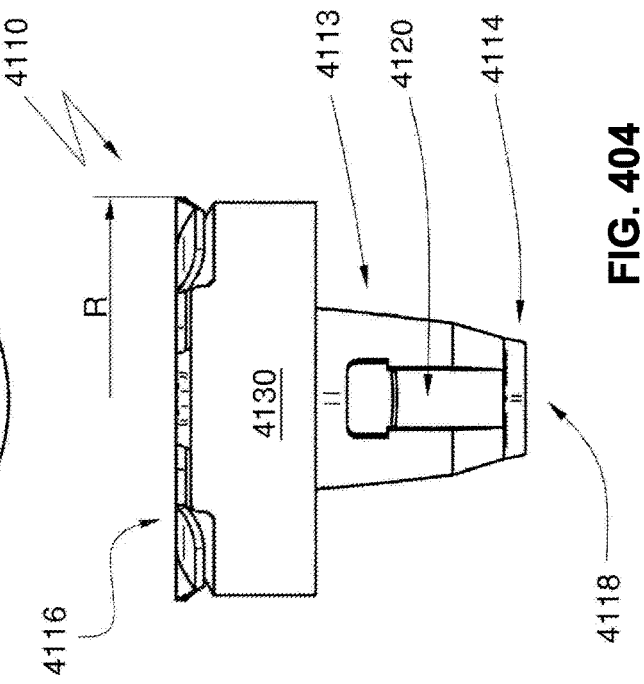

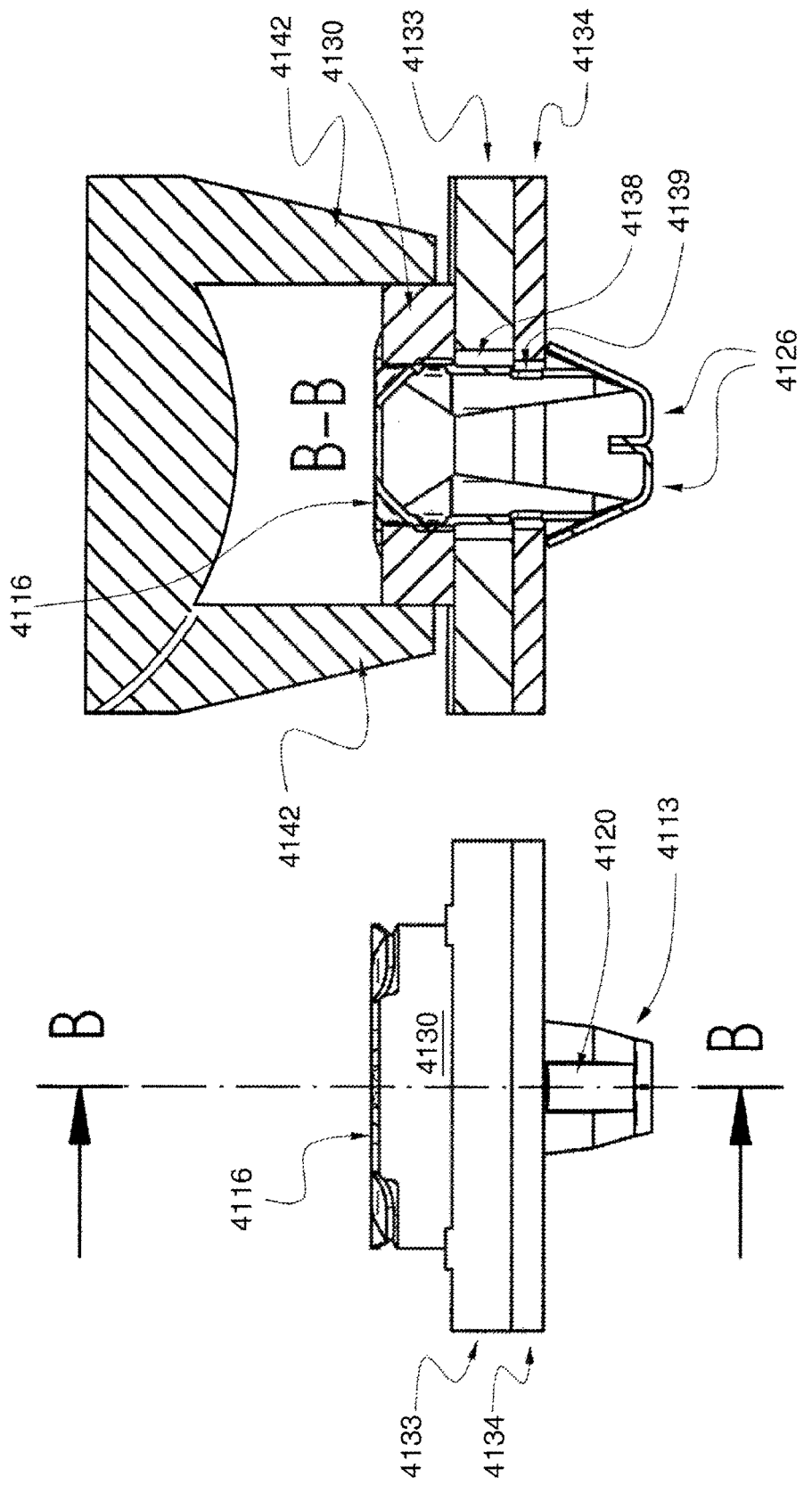

FASTENING ELEMENT

RELATED APPLICATIONS

This application is a continuation of International Application PCT/DE2014/200230 filed on May 21, 2014 claiming priority from German patent applications
DE 20 2013 006 326.2 filed on Jul. 15, 2013,
DE 20 2013 006 325.4 filed on Jul. 15, 2013,
DE 20 2013 007 589.9 filed on Aug. 24, 2013, and
DE 20 2014 001 330.6 filed on Feb. 17, 2014,
all of which are incorporated in their entirely by this reference.

FIELD OF THE INVENTION

The invention relates to a fastening element.

BACKGROUND OF THE INVENTION

Fastening elements of this general type are not known in the lamp field.

Similar fastening elements, however, are used in the automotive industry and are designated as expansion rivets. A similar fastening element is known from example from WO 2005/071273 A1 relating to different art. This expansion rivet is typically used in the automotive industry to fixate interior fairing elements at a vehicle body.

In the lamp industry LEDs are increasingly used as illuminants. LEDs are typically arranged on a circuit board which typically provides good heat dissipation. Conductive paths are arranged on a top side of the circuit board in order to electrically connect the LEDs. These conductive paths have to be offset relative to metal elements or they have to be insulated. These circuit boards are attached on a reactive bearing which is configured for example as a cooling element and which represents a lamp element or forms a portion of a lamp housing. During assembly of the circuit board on the lamp element selecting a correct contact pressure is very important since the contact pressure is a significant factor for quality of the heat dissipation from the LED to the lamp element.

A fastening element which fixates individual circuit boards provided with LEDs on a lamp element is known for example from DE 10 2008 005 823 A1. Thus, an annular connecting element is placed onto the circuit board and supports the circuit board between itself and a reaction bearing, for example a cooling element. The connecting element is connected with the reaction bearing through bolts. The tightening torque of the bolts defines the contact pressure between the circuit board and the reaction bearing.

Increasing mass production of LED lamps of various types requires fastening elements for the circuit boards provided with LEDs which fastening elements are configured for automated manufacturing methods. Thus, fastening elements of this type have to satisfy stringent requirements with respect to permanently supporting the circuit board and permanently maintaining the contact pressure. These requirements are due to a projected service life of the LED illuminant of up to 50,000 hours.

Thus, it is an object of the invention to provide a fastening element which is configured for an automated fabrication of lamps and which provides a defined contact pressure between the LED and the lamp element.

BRIEF SUMMARY OF THE INVENTION

The object of the invention is achieved by a fastening element including a shaft; a shaft head arranged at an end of the shaft, wherein the shaft head has a larger diameter than the shaft, wherein the fastening element is provided for arranging a first component and a second component at each other, wherein the first component is provided as a circuit board provided with a LED and the second component is provided as a heat dissipating lamp element, wherein the shaft is insertable through a pass through opening of the first component and the shaft head is configured at least for an indirect contact at the first component, wherein the shaft is arrangeable in a recess of the second component, wherein the shaft is fixable at least through friction locking in the recess of the second component, wherein the fastening element is provided with an insulating element which is arranged between the shaft head and the first component and prevents a contact of the shaft head and the first component, wherein the fastening element is provided with a clamping element which clamps the first component against the second component through the shaft head, wherein the insulating element is made from a spring elastic material and functions as the clamping element, wherein the shaft includes diameter expending support elements configured as interlocking hooks which are configured to enter a form locking engagement with the second component, wherein a free end of at least one shaft lobe is crimped and forms a support element which is supported at another shaft lobe, wherein the support element supports the at least one shaft lobe and the other shaft lobe in a rigid manner in a normal position in which the interlocking hooks protrude beyond an inner radius in a circumference expanding manner.

The object is also achieved by an arrangement including the fastening element recited supra; the first component; and the second component, wherein the shaft head contacts an insulation element, wherein the insulation element contacts the first component, wherein the first component contacts the second component, wherein the clamping element is supported at the shaft head and induces a contact force between the first component and the second component.

The object is also achieved by a method for arranging two components at each other by the fastening element recited supra, wherein the first component includes a pass through opening and the second component includes a recess, the method comprising the steps arranging the first component and the second component at each other, wherein the pass through opening and the recess are aligned with each other; inserting the fastening element assembled from the retaining clamp and the insulating element with a free shaft end forward in an insertion direction through the pass through opening into the recess until the insulating element contacts the first component; sliding the interlocking hooks at edges of the pass through opening and of the recess and spring elastic displacing of the interlocking hooks into an interior space of the fastening element; continuing an insertion movement in the insertion direction with an insertion pressure that compresses the insulating element in a spring elastic manner; building up reset forces by the insulating element which reset forces act against the insertion pressure; and penetrating the recess with the interlocking hooks and interlocking the interlocking hooks at a bottom side of the second component.

An essential advantage of the fastening element according to the invention is its suitability for automated assembly. Two components, the first component corresponds to the circuit board with LED, the second component corresponds to the (amp element, are arranged at one another so that the pass through opening and the recess are aligned. The shaft of the fastening element is inserted into the recess through the pass through opening until the shaft head contacts the first component. The friction locking engagement of the shaft fixates the fastening element in the recess of the second component so that the components are fixated at each other.

The assembly robots and assembly methods required for this purpose can be developed and implemented in a simple manner. The characterizing feature of the insulation element prevents that the fastening element comes in contact with the surface of the circuit board and the conductive paths arranged thereon so that they may suffer mechanical damage or shortening in case a metal fastening element is used. The clamping element provides a clamping force between the first and the second lamp element so that good heat transfer from the LED to the lamp element s provided.

It is provided that the insulating element is made from an electrically non-conductive material, in particular since the fastening element itself is made from metal.

Providing the fastening element from metal is preferred since a metal fastening element can bear the attachment forces over years. On the other hand plastic elements are known to deform over time under load so that they yield to impacting forces. This bears the risk in particular in view of a high service life of LEDs that the attachment function is not continuously provided.

It can also be provided that the insulating element is made from a spring elastic material and used as a clamping element.

The essential advantage of this embodiment is that a number of components is reduced. Since the insulating element is arranged between the shaft head and the first component anyhow, the insulating element can be loaded with a respective clamping force through the mounting forces directed in insertion direction when fixating the fastening element so that the reset forces of the insulating element are supported at the shaft head on one side and at the first component on the other side. Thus, a contact force between the first and the second component is induced.

Under these conditions the embodiment of the fastening element made from metal has particular relevance since the fastening element itself is loaded with a force by the clamping element.

In a particularly advantageous embodiment it is provided that the shaft includes diameter expanding support elements, in particular interlocking hooks which can enter into a form locking engagement with the second component.

In particular when the fastening element cooperates with building up the contact force since the insulating device is configured as a clamping element a form locking connection is preferred. Contrary to a friction locking connection the form locking connection provides safe support of the fastening element in the recess of the second component.

It is provided that the insulating element includes a pass through opening through which the shaft of the fastening element is run. The pass through opening facilitates to provide the insulating element as a disc arranged below the shaft head while still being able to use the shaft itself for attaching the components.

In one embodiment it is provided that the shaft is formed by two shaft lobes which form an intermediary space between each other.

It is furthermore provided that the free end of at least one shaft lobe carries a support element which is supported at the other shaft lobe and supports both shaft lobes in a rigid position where they are offset from each other.

Another embodiment provides that both shaft lobes respectively include a support element and that the support elements are supported at each other.

In view of the technical task at hand the invention also relates to an arrangement according to one of the claims 1-9, a first component and a second component wherein the shaft head contacts an insulating element, the insulating element contacts the first component and the first component contacts the second component.

This arrangement achieves the object of the invention in that a clamping element is supported at the shaft head and imparts a mutual contact force between the first component and the second component.

In a first embodiment that the first insulating element is clamped by the fastening element against the first component and the reset force thus introduced generates the contact force between the first component and the second component.

BRIEF DESCRIPTION OF THE DRAWINGS

Further advantages and a better comprehension of the invention are apparent from the subsequent description of an embodiment with reference to the drawing figures, wherein:

FIG. 401 illustrates a fastening element according to the invention including a support bracket and an insulating and clamping element in an exploded view;

FIG. 402 illustrates a sub assembly of the fastening element including a support bracket, and an insulating and clamping element in a perspective view;

FIG. 403 illustrates the sub assembly according to FIG. 402 in a tope view;

FIG. 404 illustrates the sub assembly according to FIG. 402 in a first side view;

FIG. 405 illustrates the sub assembly according to FIG. 402 in a second side view;

FIG. 409 illustrates the representation according to FIG. 404 of the sub assembly in an assembled configuration; and FIG. 410 illustrates a sectional view according to the sectional line B-B in FIG. 409.

DETAILED DESCRIPTION OF THE INVENTION

Figure 408:
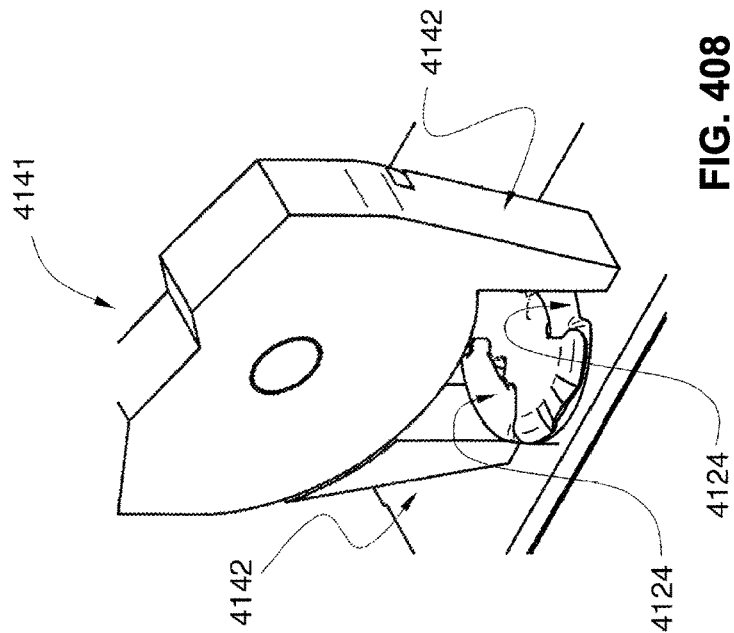
FIG. 408 illustrates a representation of the sub assembly according to FIG. 402 in an assembled configuration a perspective view with a schematic representation of a plier head.

A fastening element according to the invention is designated overall with the reference numeral 4110.

The fastening element 4110 includes a retaining bracket 4111 which includes a shaft 4112 which is formed by two shaft lobes 4113. The shaft lobes 4113 include a free end 4114 and are respectively attached at a shaft head 4116 with a joined end 4115.

The shaft lobes 4113 are offset from each other and include an intermediary space 4117 between each other. The free ends 4114 taper and form insertion trunks 4118 this way wherein the fastening element 4110 has to be assembled with the insertion trunks forward. Behind the insertion trunks 4118 in a direction towards the shaft head 4116 each shaft lobe 4113 forms support elements 4119 which are embodied as interlocking hooks 4120 which are oriented in outward direction, this means away from the intermediary space 4117. A shaft neck 4121 arranged thereafter in a direction of the shaft head 4116 transitions into a shaft disengagement section 4122 into which an engagement cam 4123 is embossed that is also oriented in an outward direction.

The shaft head 4116 is configured substantially disc shaped and defines a plane relative to which the shaft lobes 4113 are essentially oriented orthogonal. An imaginary inner radius r of the shaft head 4116 corresponds approximately to a radius of a pass through opening 4138 in a first component 4113 and a recess 4139 in a second component 4134 into which the shaft 4112 of the fastening element 4110 is insertable. Therefore the shaft lobes 4113 are arranged on this radius r.

In a portion of the connection of the shaft lobes 4113 at the shaft head 4116 the shaft head 4116 therefore includes recesses which are configured as engagement recesses 4124. In these portions the shaft head tapers from an outer radius R down to an inner radius r.

A portion of the fastening element 4110 is therefore formed by an insulating element 4130. The insulating element 4130 is configured approximately annular or annular disc shaped in the first embodiment described herein. The inner ring cavity is configured as a pass through opening 4143.

As apparent in particular from FIGS. 402, 404 and 405 the insulating element 4130 is provided to be arranged under the shaft head 4116. Thus, the shaft lobes 4113 are slid through the pass through opening 4143 until the insulating element 4130 contacts a bottom side of the shaft head 4116.

Figure 407:
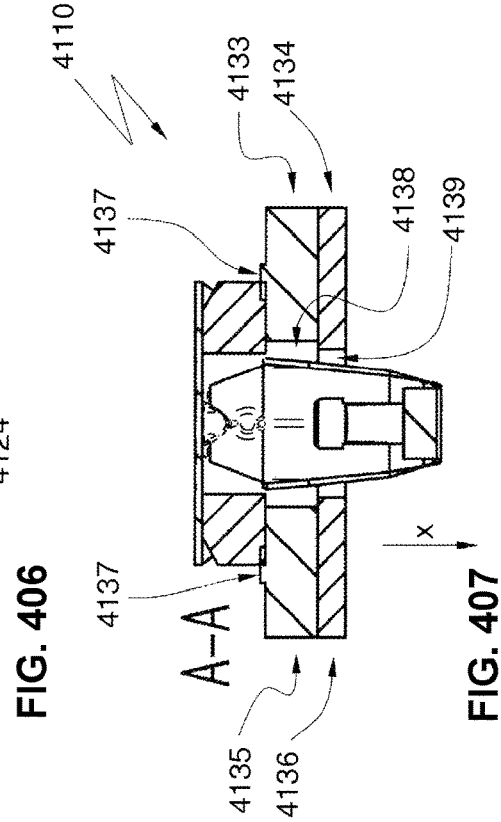
FIG. 407 illustrates a sectional view according to the sectional line A-A in FIG. 406.

As apparent from FIGS. 403, 404 and 405 a bottom side of the shaft head 4116 contacts a top side of the insulating element 4130, whereas a bottom side of the insulating element 4130 is provided for a contact on the first component 4133 (FIG. 407). FIG. 405 furthermore illustrates that the shaft lobes 4113 are deformed inward at their free ends 4114 and respectively include support elements 4126 that are oriented towards each other and supported at each other. The support elements 4126 support the shaft lobes 4113 in a rigid manner in their normal position in which the interlocking hooks 4120 protrude beyond the inner radius r in a circumferential expanding manner.

Eventually it is appreciated that the retaining bracket 4111 is advantageously made from a piece of sheet metal through a stamping and crimping process. The insulating element 4130 is made from an electrically non-conductive and spring elastic material. According to an advantageous embodiment the insulating element 4130 is mad from silicone. Other spring elastic plastic materials, however, are suited as well.

Figure 406:
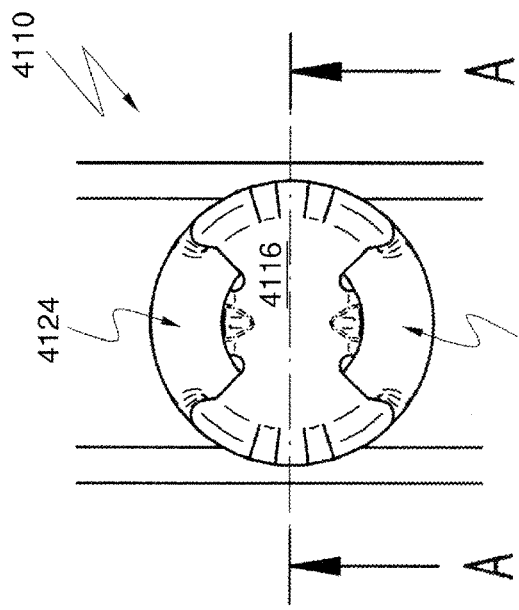
FIG. 406 illustrates the representation according to FIG. 403 in an assembled configuration.

FIG. 407 illustrates a sectional view of the fastening element 4110 in an installed condition according to the sectional line A-A in FIG. 406. A first component 4133 is initially illustrated which contacts a second component 4134. The first component 4133 typically is a circuit board 4135, the second component 4134 typically is a lamp element 4136. The circuit board 4135 is provided with conductive paths 4137 which are used for electricity or signal supply for LEDs that are not illustrated which are arranged on the circuit board 4135. The circuit board 4135 is provided with a pass through opening 4138, the lamp element 4136 includes a recess 4139. it is appreciated that the pass through opening 4138 in the first component 4133 has to be configured as a pass through opening 4138 over the entire material thickness. The recess 4139 of the second component 4134 in the illustrated embodiment is also configured as a bore hole penetrating the material over the entire thickness. The recess 4139 of the second component 4134 however can also be configured as a dead hole. The pass through opening 4138 and the recess 4139 are aligned with each other.

In order to connect the first component 4133 and the second component 4134 with each other both components as illustrated in FIG. 407 are arranged on top of each other so that the pass through opening 4138 and 4139 are aligned with each other. Then the subassembly put together according to FIG. 402 to form the fastening element 4110 including a retaining bracket 4111 and an insulating element 4130 are inserted in the insertion direction X through the pass through opening 4138 into the recess 4139. Thus, the fastening element 4110 is inserted into the pass through opening 4138 and the recess 4139 with the free end 4114 of the shaft 4112, in particular with the insertion trunks 4118 of the shaft lobes 4113 forward. Eventually the insulating element 4130 contacts the surface of the circuit board 4135 with conductive paths 4137.

A diameter of the pass through opening 4138 corresponds at least to an inner radius r and is smaller than an outer radius R of the shaft head 4116. The recess 4139 corresponds approximately to the inner radius r in order to provide safe anchoring of the interlocking hooks 4120.

When inserting the fastening element 4110 in the direction X the interlocking hooks 4120 protruding beyond the inner radius r in a diameter expanding manner extend at the edges from the pass through opening 4138 and the recess 4139. Since the interlocking lobes 4113 are supported at each other in a rigid manner the interlocking hooks 4120 are moved in a spring elastic manner in a direction towards the inner cavity 4117.

When the insulating element 4130 contacts the surface of the circuit board 4135 an insertion movement in a direction X that is required for anchoring both components 4133/4134 at each other is not yet completed. The interlocking hooks 4120 have at least not completely penetrated the recess 4139 of the second component 4134. Thus, a continuation of the insertion movement in a direction X is required wherein an insertion pressure is imparted onto the shaft head 4116 which compresses the insulating element 4130. Thus, the reset elastic insulating element 4130 builds up reset forces against the insertion pressure. Now the interlocking hooks 4120 penetrate the recess 4139 and interlock at its bottom side in that the reset forces move the interlocking hooks 4120 backward.

The reset forces of the insulating element 4130 acting against the insertion pressure, however, are maintained and lead to a clamping of the components 4133 and 4134 against each other, wherein the interlocking hooks 4120 on one side and the shaft head 4116 on the other side are used as reactive bearings against which the reset forces of the insulating element 4130 act. This way an exactly definable contact pressure or an exactly definable contact force is generated between the surfaces of the first component and of the second component 4133/4134 precisely contacting each other. Thus, it has become apparent from the preceding functional description that the insulating element 4130 is also used as a clamping element 4130.

Generating a defined contact pressure between the first component 4133 and the second component 4134 is particularly significant for a function of the fastening element 4110 according to the invention since the fastening element 4110 is provided in particular for attaching circuit boards provided with LEDs at heat dissipating lamp elements 4136. The heat dissipation of the circuit board 4135 to the lamp element 4136 which significantly influences service life of the LED and which is therefore necessary is influenced in a significant manner by a correct contact pressure between the first component 4113 and the second component 4134.

However, it is also provided to be able to disengage the fastening element 4110 again in order to separate the components 4133 and 4134 from each other. For this purpose the support bracket 4111 includes the engagement recesses 4124 that are visible quite well in FIG. 401 and FIG. 403 and which are briefly described supra wherein the engagement recesses provide space for a pair of vices. FIG. 408 illustrates a perspective view of a mounted fastening element 4110 which connects the component 4133 and 4134 with each other. A vice head 4141 is schematically illustrated, whose vice jaws 4142 in a portion of the engagement recesses 4124 are arranged at open sections of the insulating element 4130. FIG. 410 illustrates a sectional view of the fastening element 4110 fixating the components 4133 and 4134 at each other according to the sectional line B-B in FIG. 409. FIG. 410 furthermore illustrates the vice jaws 4142 which are omitted in FIG. 409 for clarity purposes.

In FIG. 410 it is clearly visible that the interlocking hooks 420 reach under a bottom side of the second component 4134 so that both components 4133/4134 are arranged connected with each between the insulating element 4130 and the interlocking hook 4120. The vice jaws 4142 with their operating surfaces oriented towards each other contact the exposed sections of the insulating element 4130. Closing the vice causes the vice jaws 4142 to move towards each other. Therefore a force is imparted to the disengagement cams 4123 through the intermediary positioning the insulating element 4130 which leads to a displacement of the shaft lobes 4113 in the portion of the interlocking hooks 4120 into the intermediary cavity 4117. The shaft lobes 4113 are thus deformed in a reset elastic manner and in turn built up reset forces which act against the dislocation direction of the shaft lobes 4113. As soon as the shaft lobes 4113 have been moved towards each other sufficiently the fastening element 4110 can be pulled out of the recess 4139 and the pass through opening 4138 against the insertion direction X using the vice, so that the first component 4113 and the second component are separable from each other.

It is furthermore appreciated at the retaining bracket 4111 is made from metal in an advantageous embodiment. The insulating element 4130 is advantageously made from a reset elastic silicone material. Selecting a metal as a material for the retaining bracket 4111 has the essential advantage that it sustains the reset forces imparted by the insulating element 4130, whereas a plastic material typically bears the risk that it yields to the reset forces over time. This can lead to a disengagement of the connection between the first component 4133 and the second component 4134 and has the consequence that the contact force between both components 4133/4134 is reduced which leads to a reduced heat transfer.

REFERENCE NUMERALS AND DESIGNATIONS

4110 fastening element
4111 retaining bracket
4112 shaft
4113 shaft lobe
4114 free end
4115 connected end
4116 shaft head
4117 intermediary cavity
4118 insertion tip
4119 support element
4120 interlocking hook
4121 shaft neck
4122 shaft disengagement section
4123 disengagement cam
4124 disengagement recess
4126 spring arm/spring bar
4130 insulating and clamping element
4133 first component
4134 second component
4135 circuit board
4136 lamp element
4137 conductive path
4138 pass through opening
4139 recess
4141 vice head
4142 vice jaws
4143 pass through opening
X insertion direction
r inner radius
R outer radius

What is claimed is:

1. A fastening element, comprising:
a shaft;
a shaft head arranged at an end of the shaft,
wherein the shaft head has a larger diameter than the shaft,
wherein the fastening element is provided for arranging a first component and a second component at each other,
wherein the first component is provided as a circuit board provided with a LED and the second component is provided as a heat dissipating lamp element,
wherein the shaft is insertable through a pass through opening of the first component and the shaft head is configured at least for an indirect contact at the first component,
wherein the shaft is arrangeable in a recess of the second component,
wherein the shaft is fixable at least through friction locking in the recess of the second component,
wherein the fastening element is provided with an insulating element which is arranged between the shaft head and the first component and prevents a contact of the shaft head and the first component,
wherein the insulating element is made from a spring elastic material and clamps the first component against the second component through the shaft head,
wherein the shaft includes diameter expending support elements configured as interlocking hooks which are configured to enter a form locking engagement with the second component,
wherein a free end of at least one shaft lobe is crimped and forms a support element which is supported at another shaft lobe,
wherein the support element supports the at least one shaft lobe and the other shaft lobe in a rigid manner in a normal position in which the interlocking hooks protrude beyond an inner radius in a circumference expanding manner,
wherein the insulating element terminates flush on the first component, and
wherein the interlocking hooks engage a side of the second component that is oriented away from the fist component.

2. The fastening element according to claim 1, wherein the insulating element is made from an electrically non-conductive material.

3. The fastening element according to claim 1, wherein the fastening element is made from metal.

4. The fastening element according to claim 1, wherein the insulating element includes a pass through opening through which the shaft of the fastening element is run.

5. The fastening element according to claim 1, wherein the shaft is formed by two parallel shaft lobes.

6. The fastening element according to claim 1, wherein both shaft lobes respectively include a support element and the support elements are supported at each other.

7. An arrangement, comprising:
   the fastening element according to claim 1;
   the first component; and
   the second component,
   wherein the shaft head contacts the insulating element,
   wherein the insulating element contacts the first component,
   wherein the first component contacts the second component,
   wherein the insulating element is supported at the shaft head and induces a contact force between the first component and the second component.

8. The arrangement according to claim 7, wherein the insulating element is clamped against the first component by the fastening element and a reset force thus induced generates a contact force between the first component and the second component.

9. A method for arranging two components at each other by the fastening element according to claim 1,
   wherein the first component includes a pass through opening and the second component includes a recess, the method comprising the steps:
   arranging the first component and the second component at each other, wherein the pass through opening and the recess are aligned with each other;
   inserting the fastening element assembled from the retaining clamp and the insulating element with a free shaft end forward in an insertion direction through the pass through opening into the recess until the insulating element contacts the first component;
   sliding the interlocking hooks at edges of the pass through opening and of the recess and spring elastic displacing of the interlocking hooks into an interior space of the fastening element;
   continuing an insertion movement in the insertion direction with an insertion pressure that compresses the insulating element in a spring elastic manner;
   building up reset forces by the insulating element which reset forces act against the insertion pressure; and
   penetrating the recess with the interlocking hooks and interlocking the interlocking hooks at a bottom side of the second component.

\* \* \* \* \*

UNITED STATES PATENT AND TRADEMARK OFFICE
CERTIFICATE OF CORRECTION

PATENT NO. : 10,151,458 B2
APPLICATION NO. : 14/933292
DATED : December 11, 2018
INVENTOR(S) : Olaf Baumeister et al.

It is certified that error appears in the above-identified patent and that said Letters Patent is hereby corrected as shown below:

On the Title Page

Item (30), please add:
Foreign Application Priority Data:
GERMANY 202014001330.6 02-17-2014
GERMANY 202013007589.9 08-24-2013
GERMANY 202013006325.4 07-15-2013
GERMANY 202013006326.2 07-15-2013

Signed and Sealed this
Fourth Day of June, 2019

Andrei Iancu
*Director of the United States Patent and Trademark Office*